United States Patent
Lee et al.

(10) Patent No.: US 7,249,294 B2
(45) Date of Patent: Jul. 24, 2007

(54) SEMICONDUCTOR MEMORY DEVICE WITH REDUCED PACKAGE TEST TIME

(75) Inventors: Jun-Keun Lee, Ichon-shi (KR); Byung-Jae Lee, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 873 days.

(21) Appl. No.: 10/331,728

(22) Filed: Dec. 31, 2002

(65) Prior Publication Data
US 2003/0235090 A1 Dec. 25, 2003

(30) Foreign Application Priority Data
Jun. 24, 2002 (KR) .............. 2002-35451
Jun. 24, 2002 (KR) .............. 2002-35457

(51) Int. Cl.
G11C 29/00 (2006.01)
G11C 7/00 (2006.01)

(52) U.S. Cl. .............. 714/718; 365/201

(58) Field of Classification Search .............. 714/718
See application file for complete search history.

(56) References Cited

U.S. PATENT DOCUMENTS 5,896,039 A * 4/1999 Brannigan et al. .......... 324/763
6,229,726 B1 * 5/2001 Wang et al. .......... 365/51
6,976,200 B1 * 12/2005 Ohbayashi .......... 714/727
7,076,705 B2 * 7/2006 Ohbayashi .......... 714/724

FOREIGN PATENT DOCUMENTS

| JP | 06069425 A | * | 3/1994 |
| JP | 2000-150564 | | 5/2000 |
| KR | 2002-35457 | | 6/2004 |

* cited by examiner

*Primary Examiner*—Cynthia Britt
(74) *Attorney, Agent, or Firm*—Lowe Hauptman & Berner, LLP

(57) ABSTRACT

A semiconductor memory device capable of performing a package test with bandwidth other than the default bandwidth without any wiring modification with respect to package option pads reduces package test time. The present invention implements the other package options based upon the wire bonding with an internal option. According to the operation mode, buffer control signals are used to control a VDD or VSS applied to the package option pads via the wire bonding. Buffer control signal are generated using a mode register reset. The buffer receiving the buffer control signal outputs the signal corresponding to the wiring state of the package option pad, blocks the signal path from the package option pads, and outputs a signal corresponding to a package option other than the default package option.

23 Claims, 11 Drawing Sheets

FIG. 2
[PRIOR ART]

| X4 | X8 | X16 | | | X16 | X8 | X4 |
|---|---|---|---|---|---|---|---|
| VDD | VDD | VDD | 1[1] | [54]66 | VSS | VSS | VSS |
| NC | DQ0 | DQ0 | 2[2] | [53]65 | DQ15 | DQ7 | NC |
| VDDQ | VDDQ | VDDQ | 3[3] | [52]64 | VSSQ | VSSQ | VSSQ |
| NC | NC | DQ1 | 4[4] | [51]63 | DQ14 | NC | NC |
| DQ0 | DQ1 | DQ2 | 5[5] | [50]62 | DQ13 | DQ6 | DQ3 |
| VSSQ | VSSQ | VSSQ | 6[6] | [49]61 | VDDQ | VDDQ | VDDQ |
| NC | NC | DQ3 | 7[7] | [48]60 | DQ12 | NC | NC |
| NC | DQ2 | DQ4 | 8[8] | [47]59 | DQ11 | DQ5 | NC |
| VDDQ | VDDQ | VDDQ | 9[9] | [46]58 | VSSQ | VSSQ | VSSQ |
| NC | NC | DQ5 | 10[10] | [45]57 | DQ10 | NC | NC |
| DQ1 | DQ3 | DQ6 | 11[11] | [44]56 | DQ9 | DQ4 | DQ2 |
| VSSQ | VSSQ | VSSQ | 12[12] | [43]55 | VDDQ | VDDQ | VDDQ |
| NC | NC | DQ7 | 13[13] | [42]54 | DQ8 | NC | NC |
| NC | NC | NC | 14 | 53 | NC | NC | NC |
| VDDQ | VDDQ | VDDQ | 15 | 52 | VSSQ | VSSQ | VSSQ |
| NC | NC | LDQS | 16 | 51 | UDQM | DQS | DQS |
| NC | NC | NC | 17 | 50 | NC | NC | NC |
| VDD | VDD | VDD | 18[14] | 49 | VREF | VREF | VREF |
| NC | NC | NC | 19 | [41]48 | VSS | VSS | VSS |
| NC | NC | LDM | 20[15] | [40]47 | UDM | DM | DM |
| /WE | /WE | /WE | 21[16] | 46 | /CK | /CK | /CK |
| /CAS | /CAS | /CAS | 22[17] | [39]45 | CK | CK | CK |
| /RAS | /RAS | /RAS | 23[18] | [38]44 | CKE | CKE | CKE |
| /CS | /CS | /CS | 24[19] | [37]43 | NC | NC | NC |
| NC | NC | NC | 25 | [36]42 | A12 | A12 | A12 |
| BA0 | BA0 | BA0 | 26[20] | [35]41 | A11 | A11 | A11 |
| BA1 | BA1 | BA1 | 27[21] | [34]40 | A9 | A9 | A9 |
| A10/AP | A10/AP | A10/AP | 28[22] | [33]39 | A8 | A8 | A8 |
| A0 | A0 | A0 | 29[23] | [32]38 | A7 | A7 | A7 |
| A1 | A1 | A1 | 30[24] | [31]37 | A6 | A6 | A6 |
| A2 | A2 | A2 | 31[25] | [30]36 | A5 | A5 | A5 |
| A3 | A3 | A3 | 32[26] | [29]35 | A4 | A4 | A4 |
| VDD | VDD | VDD | 33[27] | [28]34 | VSS | VSS | VSS |

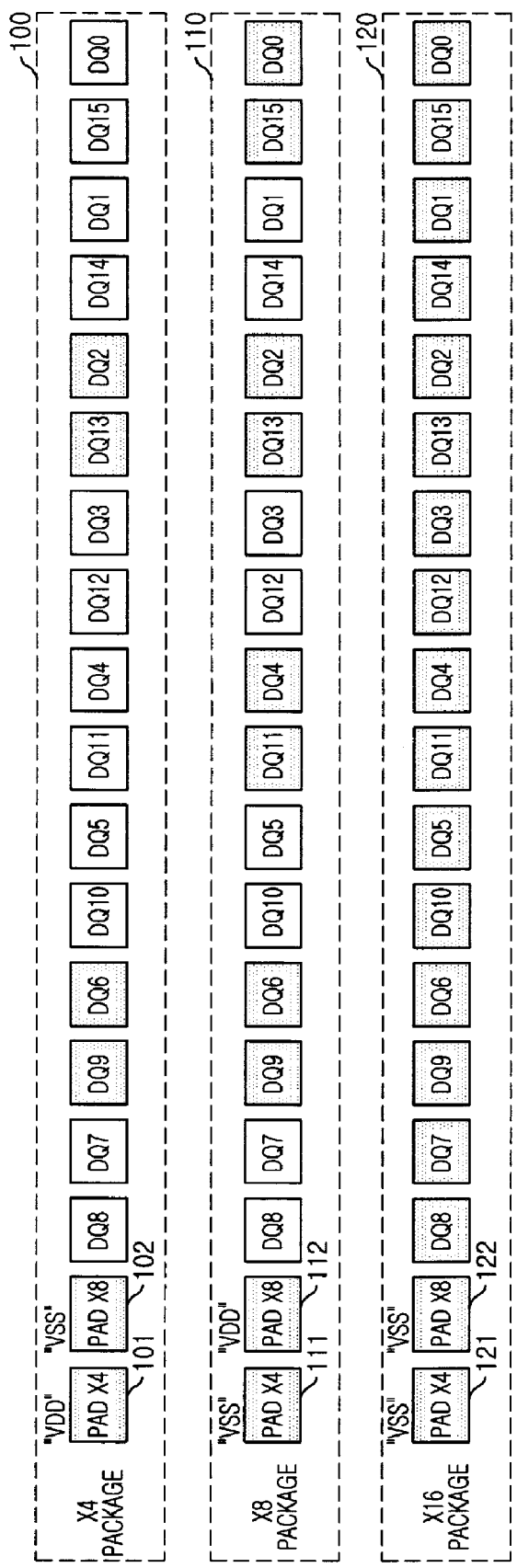
FIG. 3 [PRIOR ART]

SEMICONDUCTOR MEMORY DEVICE WITH REDUCED PACKAGE TEST TIME

FIELD OF THE INVENTION

The present invention relates to a semiconductor memory device and, more particularly, to package and test technique of a semiconductor memory device.

DESCRIPTION OF THE PRIOR ART

Recently, a main trend on technical fields related to a semiconductor memory device changes from an integration to an operating speed. Therefore, high-speed synchronous memory devices such as double data rate synchronous dynamic random access memory (DDR SDRAM) and RAMBUS DRAM have been focused as a new topic subject. The synchronous memory device is a memory operating in synchronization with an external system clock and SDRAM among the DRAMs has been a main stream in commercially available memory market. In input/output operations, the SDRAM performs data access one time at every clock in synchronization with rising edges of clocks. On the other hand, the high-speed synchronous memory device such as the DDR SDRAM operates in synchronization with falling edges as well as rising edges of clocks so that data access can be performed two times at every clock.

The DRAM products that are being manufactured have X4/X8/X16 bandwidths. In other words, each DRAM product can have different pin arrangements and wirings between pins and data pads in the DRAM product according to the bandwidth.

FIG. 1 is a diagram showing a pin arrangement of conventional X4 and X16 SDRAMs (54 pins).

Referring to FIG. 1, an X16 SDRAM includes data I/O pins DQ0 to DQ15, address pins A0 to A12, bank address pins BA0 and BA1, power pins VDD, VSS, VDDQ and VSSQ, data mask pins LDQM and UDQM, command pins /WE, /CAS, /RAS and /CS, a clock pin CK, and a clock enable pin CKE, and each of them are wire-bonded with pads of a die via lead frames. In case of the X16 SDRAM, 16 DQ pins are all used, and only one pin among the 54 pins is no-connection (NC).

Meanwhile, since an X4 SDRAM uses only 4 DQ pins (i.e., DQ0, DQ1, DQ2 and DQ3), the other 12 DQ pins are in no-connection state. Since the lower data mask pin LDQM among the data mask pins LDQM and UDQM remains in the NC state, the total 14 pins among the 54 pins remain in the NC states.

Since data mask signals are controlled by bit unit, one data mask pin (DQM) is used in the X4 or X8 SDRAM and two data mask pins (LDQM, UDQM) are used in the X16 SDRAM.

FIG. 2 is a diagram showing a pin arrangement of conventional X4/X8/X16 DDR SDRAMs (66 pins).

Referring to FIG. 2, the pin arrangement of DDR SDRAM is almost similar to that of SDRAM except that the DDR SDRAM uses data strobe pins LDQS, UDQS and DQS, a reference voltage pin VREF, a clock bar pin /CK. In other words, the X16 DDR SDRAM uses 16 DQ pins and the X8 DDR SDRAM uses 8 DQ pins. The X4 DDR SDRAM uses 4 DQ pins.

While the X16 DDR SDRAM uses two bonded data mask pins LDM and UDM, the X4 or X8 DDR SDRAM does not use the lower data mask pin LDM and remains in the NC state. In addition, the X4 or X8 DDR SDRAM uses one data mask pin DM. While the X16 DDR SDRAM uses two bonded data strobe pins LDQS and UDQS, the X4 or X8 DDR SDRAM does not use the lower strobe pin LDQS and remains in the NC state so that only one data strobe pin DQS is used.

As shown in FIGS. 1 and 2, all the semiconductor memory devices have respectively different pin arrangements and wirings according to bandwidths.

Meanwhile, the integrity of semiconductor memory device is increased and several ten millions of cells are integrated within one memory chip. If the number of memory cells is increased, it takes much time to test whether the memory cells are normal or defective. In this package test, the package test time as well as the accuracy of test results must be considered.

To meet these demands in view of the package test time, a parallel test which can perform multi-bit access at the same time is suggested. However, the parallel test has a disadvantage in that differences between data paths or power noise may not be reflected in the test and may therefore affect test reliability.

Accordingly, in order to more accurately check characteristics of product, non-compression method whose test time is long must be used. A following description is made on the assumption of the non-compression method.

FIG. 3 is a conventional wire bonding diagram according to package options.

Referring to FIG. 3, in case of an X4 product 100, a package option pad (PAD X4) 101 is wire-bonded with a VDD pin and another package option pad (PAD X8) 102 is wire-bonded with a VSS pin. In FIG. 3, dark portions represent pads wire-bonded with package leads, and bright portions represent floating states. Meanwhile, in case of an X8 product 110, a package option pad (PAD X4) 111 is wire-bonded with a VSS pin, and another package option pad (PAD X8) 112 is wire-bonded with a VDD pin. In case of an X16 product 120, package option pads (PAD X4) 121 and (PAD X8) 122 are wire-bonded with VSS pin.

FIG. 4 is a circuit diagram of a conventional package option signal generation block.

Referring to FIG. 4, VDD or VSS applied to the package option pads PAD X4 and PAD X8 are buffered through buffer units 130 and 140 and outputs as package option signals sX4 and sX8. Here, the buffer units 130 and 140 are provided with two inverters.

A following table 1 is a package option table of an operation bandwidth according to the wire bonding.

TABLE 1

|  | X4 | X8 | X16 |
|---|---|---|---|
| PAD X4 | VDD | VSS | VSS |
| PAD X8 | VSS | VDD | VSS |
| SX4 | H | L | L |
| SX4 | L | H | L |

Referring to the table 1, if the package option signals sX4 and sX8 are a logic high (H) level and a logic low (L) level, respectively, corresponding chip operates as X4. The package option signals sX4 and sX8 are a logic low (L) level and a logic high (H) level, respectively, corresponding chip operates as X8. The package option signal sX4 and sX8 are all a logic low (L) level, and corresponding chip operates as X16.

A following table 2 is an address scramble of a conventional SDRAM (DDR SDRAM).

TABLE 2

| ADDRESS | A0 | A1 | A2 | A3 | A4 | A5 | A6 | A7 | A8 | A9 | A11 | A12 |
|---|---|---|---|---|---|---|---|---|---|---|---|---|
| X4 PACKAGE | Y0 | Y1 | Y2 | Y3 | Y4 | Y5 | Y6 | Y7 | Y8 | Y9 | Y11 | Y12 |
| X8 PACKAGE | Y0 | Y1 | Y2 | Y3 | Y4 | Y5 | Y6 | Y7 | Y8 | Y9 | Y11 | NC |
| X16 PACKAGE | Y0 | Y1 | Y2 | Y3 | Y4 | Y5 | Y6 | Y7 | Y8 | Y9 | NC | NC |

Referring to the table 2, in case of the X16 package, 10 Y addresses (column addresses) Y0 to Y9 are sequentially counted with respect one word line. The entire cells connected to the word line can be screened by performing test 1024 times. At this time, 16 data are inputted/outputted through the bonded pads. In addition, in case of the X8 package, 11Y addresses Y0 to Y11 are sequentially counted with respect one word line. The entire cells connected to the word line can be screened by performing test 2048 times. At this time, 8 data are inputted/outputted through the bonded pads, so that the test time is taken longer two times compared with the X16 package. In case of the X4 package, 12Y addresses Y0 to Y12 are sequentially counted with respect one word line. The entire cells connected to the word line can be screened by performing test 4096 times. At this time, 4 data are inputted/outputted through the bonded pads, so that the test time is taken longer four times compared with the X16 package. In other words, as the bonded number of DQ pads with respect to the number of physical DQ pads is smaller, the number of data inputted/outputted at one time is reduced so that the entire test time is increased.

According to the above-described prior art, once the wiring with respect to the package option pads is completed, the test can be performed by using only one package option corresponding to the wiring state at a test mode operation as well as a normal mode operation. Therefore, the X8 or X4 package option needs a long test time.

Meanwhile, in another aspect, if performing only a test with respect to one package option determined by the wire bonding of the package option pads, it is difficult to detect failure according to change of bandwidths. Therefore, there are many cases that the test is performed with respect to other package options as well as corresponding package option. In particular, in case of product bonded with the X4 or X8 package, since some of the DQ pins are in the NC states, it is difficult to test the package characteristic of upper bandwidth. However, in case of products bonded with the X16 package, it is possible to test the characteristic of the bandwidth of X8 or X4 package.

When assuming characteristic of the products bonded with X16 package is tested, in order to test the X4 or X8 package characteristic, the wiring with respect to the package option pad must be modified. In other words, after testing the X8 package characteristic, the wiring is again modified and then the X4 package characteristic is tested. In this case, since the wiring modifications corresponding to the respective package options are needed, there is a problem that the packing cost and test time are increased.

SUMMARY OF THE INVENTION

It is, therefore, an object of the present invention to provide a semiconductor memory device capable of performing a package test with bandwidth except for default bandwidth without any wiring modification with respect to package option pads.

In accordance with an aspect of the present invention, there is provided a semiconductor memory device which comprises: at least one package option pad wire-bonded in a default package option; a buffer control signal generation means for generating a buffer control signal; and a buffering means for buffering a signal applied to the package option pad in a normal mode in response to the buffer control signal and outputting the buffered signal as a package option signal, blocking the signal applied to the package option pad in a test mode, and outputting a signal corresponding to package option pads except for the default package option as the package option signal.

In accordance with another aspect of the present invention, there is provided a semiconductor memory device which comprises: first and second package option pads wire-bonded in a default package option; a buffer control signal generation means for generating a buffer control signal; a first buffering means for buffering a signal applied to the first package option pad in a normal mode in response to the buffer control signal and outputting the buffered signal as a first package option signal, blocking the signal applied to the first package option pad in a test mode, and outputting a signal corresponding to package option pads except for the default package option as the first package option signal; and a second buffering means for buffering a signal applied to the second package option pad in a normal mode in response to the buffer control signal and outputting the buffered signal as second a package option signal, blocking the signal applied to the second package option pad in a test mode, and outputting a signal corresponding to package options except for the default package option as the second package option signal.

In accordance with further another aspect of the present invention, there is provided a semiconductor memory device which comprises: at least one package option pad wire-bonded in a default package option; a buffer control signal generation means for generating a buffer control signal; a buffering means for buffering signals applied to the package option pad; and a switching means for transferring an output of the buffering means and a signal corresponding to package options except for the default package option in response to the buffer control signal as a package option signal.

BRIEF DESCRIPTION OF THE DRAWINGS

Other objects and aspects of the invention will become apparent from the following description of the embodiments with reference to the accompanying drawings, in which:

FIG. 2 is a diagram showing a pin arrangement of conventional X4/X8/X16 DDR SDRAMs (66 pins);

FIG. 3 is a conventional wire bonding diagram according to package options;

DETAILED DESCRIPTION OF THE PREFERRED EMBODIMENTS

Hereinafter, preferred embodiments of the present invention will be described in detail with reference to attached drawings.

Figure 1:
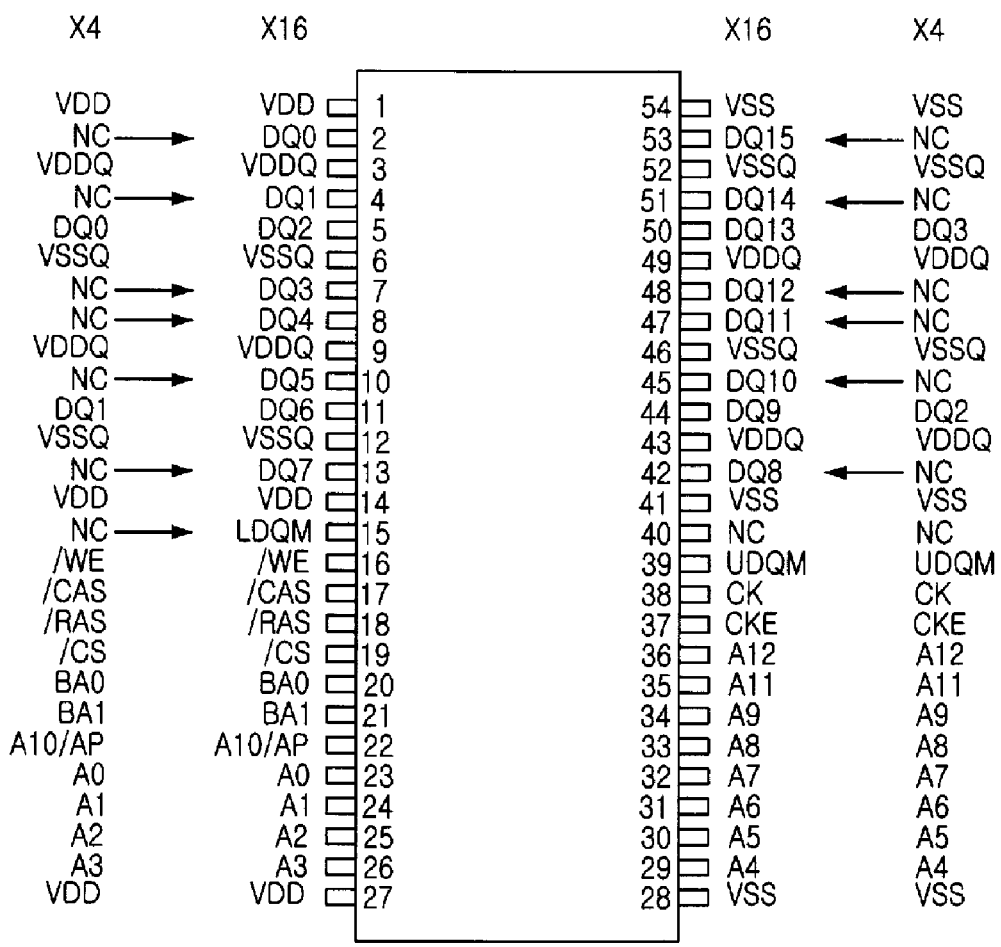
FIG. 1 is a diagram showing a pin arrangement of conventional X4 and X16 SDRAMs (54 pins)
Figure 4:
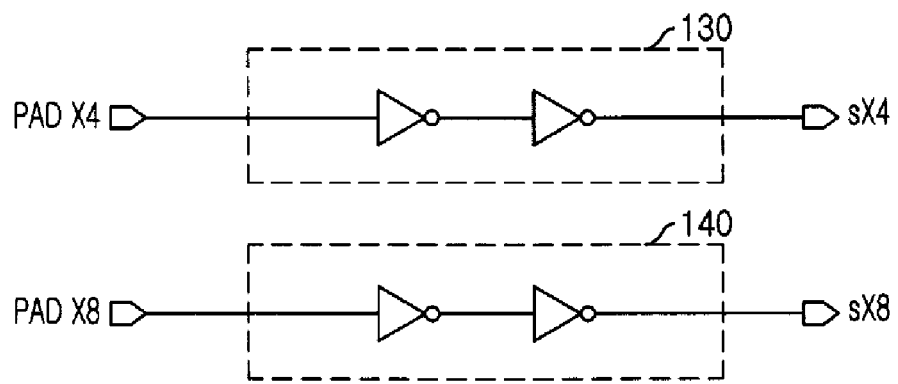
FIG. 4 is a circuit diagram of a conventional package option signal generation block.
Figure 5:
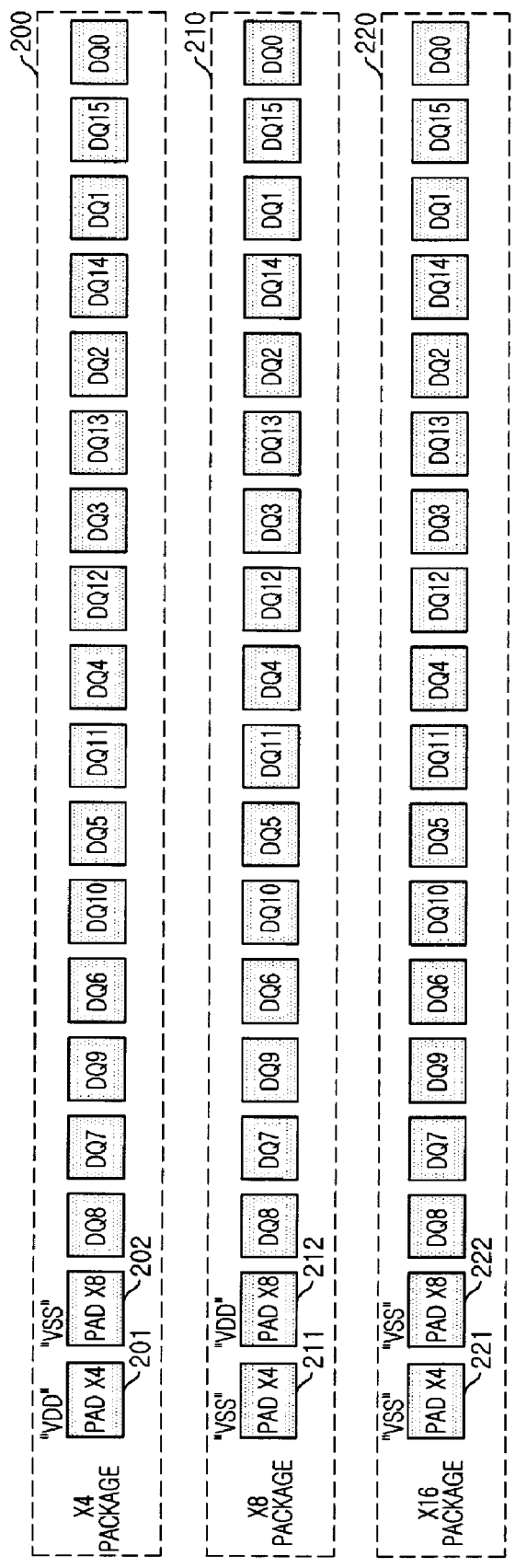
FIG. 5 is a diagram of a wire bonding structure according to package option in accordance with an embodiment of the present invention.

FIG. 5 is a diagram of a wire bonding structure according to package option in accordance with an embodiment of the present invention.

Referring to FIG. 5, in case of an X4 product 200, a package option pad (PAD X4) 201 is wire-bonded with a VDD pin and another package option pad (PAD X8) 202 is wire-bonded with a VSS pin. Meanwhile, in case of an X8 product 210, a package option pad (PAD X4) 211 is wire-bonded with a VSS pin, and another package option pad (PAD X8) 212 is wire-bonded with a VDD pin. In case of an X16 product 220, package option pads (PAD X4) 221 and (PAD X8) 222 are wire-bonded with VSS pin.

In the wire bonding structure applied to the present invention, the structure of the package option pads and the applied signals are the same as the prior art shown in FIG. 3. However, the present invention has the same wire bonding structure of DQ pin as the X16 product 220 having maximum bandwidth without regard to the X4 product 200 or the X8 product 210. In other words, all the DQ pins are wire-bonded without regard to the package options.

Figure 6:
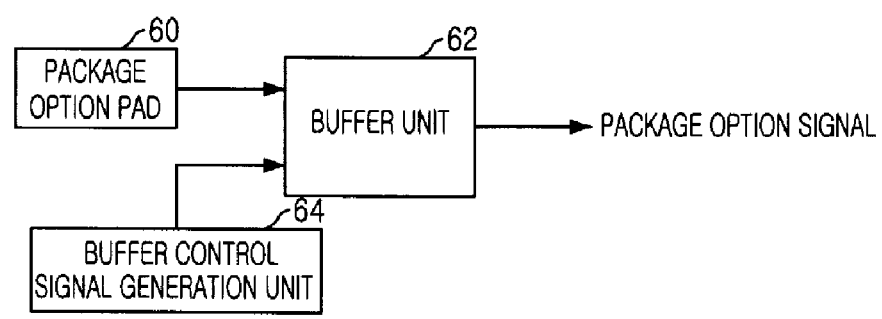
FIG. 6 a block diagram of a package option signal generation circuit in accordance with an embodiment of the present invention.

FIG. 6 a block diagram of a package option signal generation circuit in accordance with an embodiment of the present invention.

Referring to FIG. 6, the package option signal generation circuit in accordance with the present invention includes: at least one package option pad 60 wire-bonded in a default package option; a buffer control signal generation unit 64 for generating a buffer control signal; and a buffer unit 62 for buffering a signal applied to the package option pad 60 in response to the buffer control signal and outputting the buffered signal, or blocking the signal applied to the package option pad 60 and outputting a signal corresponding to package option pads except for the default package option as the package option signal. Here, the buffer control signal generation unit 64 is a test mode signal generation circuit using a mode register set.

The buffer control signal is disabled during a normal mode operation so that the buffer unit 62 buffers the signal applied to the package option pad 60 via a bonding wire to generate the buffered signal to the package option signal. In other words, during the normal mode operation, the semiconductor memory device operates with bandwidth corresponding to the default package option. Meanwhile, during a test mode operation, the buffer control signal is enabled so that the buffer unit 62 blocks the signal inputted from the package option pad 60 and outputs the package option signal corresponding to the package options except for the default package option. In other words, during the test mode operation, the semiconductor memory device operates with bandwidth except for the default bandwidth. At this time, in case where the buffer control signal generation unit 64 outputs one buffer control signal, the bandwidth that can be selected during the test mode is also one. On the contrary, in case where the buffer control signal generation unit 64 outputs two or more buffer control signals, it is possible to perform the test with respect to a plurality of bandwidths during the test mode.

FIRST EMBODIMENT

In the first embodiment of the present invention, two package option pads PAD X4 and PAD X8 are used. There is proposed a circuit which selectively outputs package option signals sX4 and sX8 according to the operation modes through a logic combination of signals applied to the two package option pads PAD X4 and PAD X8 from the buffer unit 62 of FIG. 6 and buffer control signals enX8 and enX16.

Figure 7:
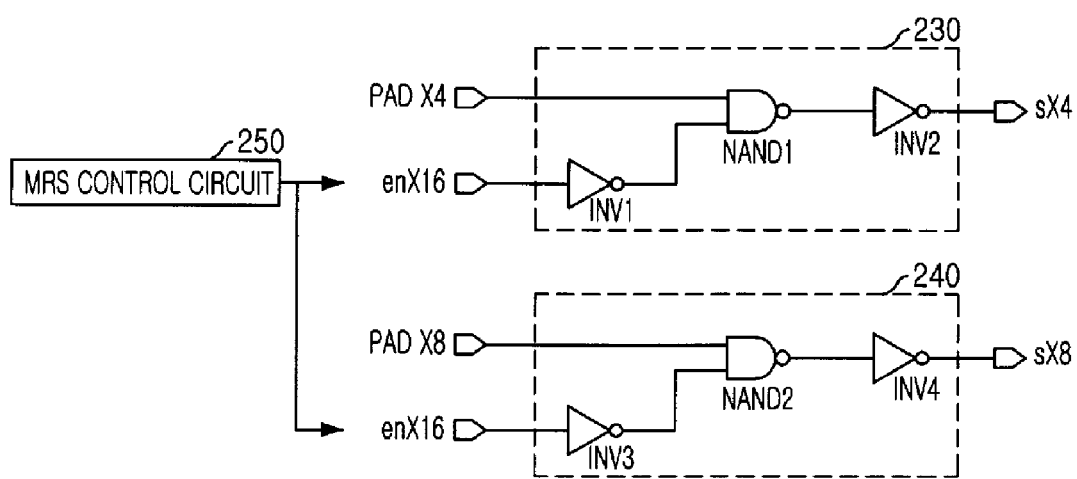
FIGS. 7 to 12 are exemplary circuit diagrams of the buffer unit in accordance with a first embodiment of the present invention.

FIG. 7 is a first exemplary circuit diagram of the buffer unit 62 in accordance with the first embodiment of the present invention.

Referring to FIG. 7, the buffer unit 62 includes: a first buffer unit 230 for buffering a signal applied to the package option pads PAD X4 wire-bonded according to the package options and a signal applied to the package option pad PAD X4 in the normal mode in response to the buffer control signal enX16 to output the buffered signal as a package option signal sX4, and outputting the PAD X4 option signal corresponding to the maximum bandwidth (i.e., X16 package) in the test mode as the package option signal sX4; and a second buffer unit 240 for buffering a signal applied to the package option pad PAD X8 in the normal mode in response to the buffer control signal enX16 to output the buffered signal as the package option signal sX8, and outputting the PAD X8 option signal corresponding to the maximum bandwidth (i.e., X16 package) in the test mode as the package option signal sX8. Meanwhile, a mode register set (MRS) control circuit 250 is contained in the buffer control signal generation unit 64 of FIG. 6. Here, it is assumed that the buffer control signal enX16 is a high active signal.

Meanwhile, the first buffer 230 includes: an inverter INV1 receiving the buffer control signal enX16; a NAND gate NAND1 receiving an output of the inverter INV1 and the signal applied to the package option pad PAD X4; and an inverter INV2 receiving an output of the NAND gate NAND1 to output the package option signal sX4. The second buffer 240 includes: an inverter INV3 receiving the buffer control signal enX16; a NAND gate NAND2 receiving an output of the inverter INV3 and the signal applied to the package option pad PAD X8; and an inverter INV4 receiving an output of the NAND gate NAND2 to output the package option signal sX8.

Hereinafter, an operation of the semiconductor memory device with the circuit of FIG. 7 will be described in detail.

In case of a default X4 package in which the package option pads PAD X4 and PAD X8 are respectively bonded with the VDD pin and the VSS pin, since the buffer control signal enX16 is a logic low level in the normal mode, the NAND gates NAND1 and NAND2 operate like an inverter with respect to the signals applied to the package option pads PAD X4 and PAD X8 so that the package option signals sX4 and sX8 are a logic high (H) level and a logic low (L) level, respectively. As a result, the corresponding chip operates as the X4. On the other hand, in the test mode, since the buffer control signal enX16 is enabled to a logic high (H) level, the NAND gates NAND1 and NAND2 block the signals applied to the package option pads PAD X4 and PAD X8 and always output a logic high level. Therefore, all of the package option signals sX4 and sX8 are a logic low (L) level, so that the corresponding chip operates as X16.

In case of a default X8 package in which the package option pads PAD X4 and PAD X8 are respectively bonded with the VSS pin and the VDD pin, since the buffer control signal enX16 is a logic low (L) level in the normal mode, the NAND gates NAND1 and NAND2 operate like an inverter with respect to the signals applied to the package option pads PAD X4 and PAD X8 so that the package option signals sX4 and sX8 are a logic low (L) level and a logic high (H) level, respectively. As a result, the corresponding chip operates as the X8. On the other hand, in the test mode, since the buffer control signal enX16 is enabled to a logic high (H) level, the NAND gates NAND1 and NAND2 block the signals applied to the package option pads PAD X4 and PAD X8 and always output a logic high level. Therefore, all of the package option signals sX4 and sX8 are a logic low (L) level, so that the corresponding chip operates as X16.

In case of a default X16 package in which all of the package option pads PAD X4 and PAD X8 are bonded with the VSS pin, since the buffer control signal enX16 is a logic low level in the normal mode, the NAND gates NAND1 and NAND2 operate like an inverter with respect to the signals applied to the package option pads PAD X4 and PAD X8 so that all of the package option signals sX4 and sX8 are a logic low (L) level. As a result, the corresponding chip operates as the X16. On the other hand, in the test mode, since the buffer control signal enX16 is enabled to a logic high (H) level, the NAND gates NAND1 and NAND2 block the signals applied to the package option pads PAD X4 and PAD X8 and always output a logic high level. Therefore, all of the package option signals sX4 and sX8 are a logic low (L) level, so that the corresponding chip operates as X16.

A following table 3 is an operation table of an operation bandwidth in the normal mode and the test mode according to the package option (in case of using the enX16).

TABLE 3

| PACKAGE OPTION | X4 | X8 | X16 | X4 | X8 | X16 |
|---|---|---|---|---|---|---|
| | NORMAL MODE | | | TEST MODE (enX16 "H") | | |
| PAD X4 | VDD | VSS | VSS | VDD | VSS | VSS |
| PAD X8 | VSS | VDD | VSS | VSS | VDD | VSS |
| SX4 | H | L | L | | L | |
| SX8 | L | H | L | | L | |
| OPERATION BANDWIDTH | X4 | X8 | X16 | X16 | X16 | X16 |

Referring to the table 3, in case of the normal mode, the operation bandwidth of the corresponding chip is determined according to the bonding state of the package option pads PAD X4 and PAD X8. However, in case of the test mode, the corresponding chip operates as the X16 without regard to the bonding state of the package option pads PAD X4 and PAD X8.

A following table 4 is an address scramble of an SDRAM (DDR SDRAM) in the test mode in accordance with the circuit configuration of FIG. 7.

TABLE 4

| ADDRESS | A0 | A1 | A2 | A3 | A4 | A5 | A6 | A7 | A8 | A9 | A11 | A12 |
|---|---|---|---|---|---|---|---|---|---|---|---|---|
| X4 PACKAGE | Y0 | Y1 | Y2 | Y3 | Y4 | Y5 | Y6 | Y7 | Y8 | Y9 | NC | NC |
| X8 PACKAGE | Y0 | Y1 | Y2 | Y3 | Y4 | Y5 | Y6 | Y7 | Y8 | Y9 | NC | NC |
| X16 PACKAGE | Y0 | Y1 | Y2 | Y3 | Y4 | Y5 | Y6 | Y7 | Y8 | Y9 | NC | NC |

In the normal mode, the address scramble is the same as the table 2.

However, in the test mode, since all of the X4/X8/X16 packages input/output 16 data via the bonded pads, 10Y addresses Y0 to Y9 are sequentially counted with respect to one word line. If the test is performed 1024 times, the entire cells connected to the word line can be screened. Therefore, in current maximum bandwidth (i.e., in case of the X16 product), the test time is not different from the prior art. However, in case of the X8 product, since the entire cells connected to one word line can be screen by performing the test 1024 times, the test time can be reduced to ½ of the prior art. In addition, in case of the X4 product, the test time can be reduced to ¼ of the prior art.

Figure 8:
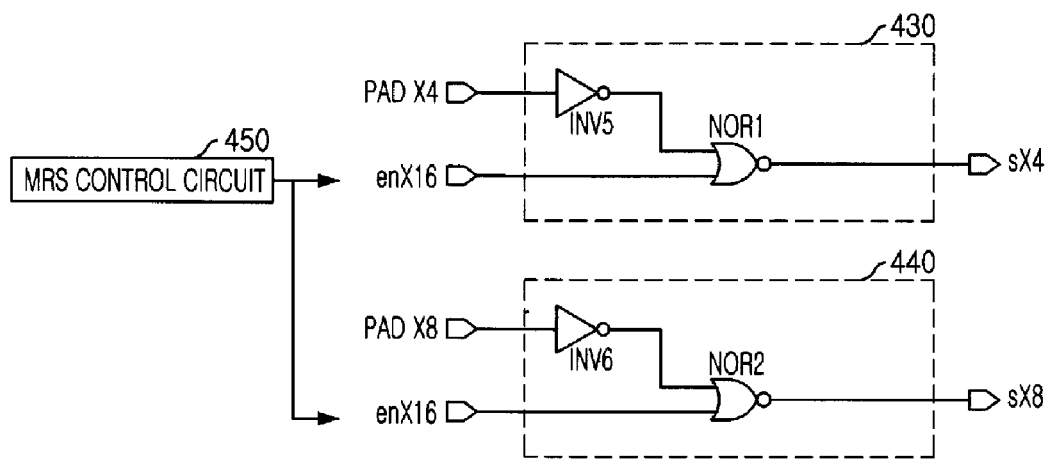

FIG. 8 is a second exemplary circuit diagram of the buffer unit 62 in accordance with the first embodiment of the present invention.

A difference between FIG. 8 and FIG. 7 is configurations of first and second buffer units 430 and 440. The first buffer unit 430 includes: an inverter INV5 receiving a signal applied to the package option pad PAD X4; and a NOR gate NOR1 receiving the buffer control signal enX16 outputted from the MRS control circuit 450 and an output of the inverter INV5 to output the package option signal sX4. The second buffer unit 440 includes: an inverter INV6 receiving a signal applied to the package option pad PAD X8; and a NOR gate NOR2 receiving the buffer control signal enX16 outputted from the MRS control circuit 450 and an output of the inverter INV6 to output the package option signal sX4.

Although the first and second buffer units 430 and 440 are implemented using the NOR gates, the buffer units operate in the same manner as those of FIG. 7 so that the operation table is also the same as the table 3. In other words, since the buffer control signal enX16 is a logic low level in the normal mode, the NOR gates NOR1 and NOR2 operate like an inverter so that the package option signals sX4 and sX8 are determined according to the bonding state of the package option pads PAD X4 and PAD X8. On the other hand, in the test mode, since the buffer control signal enX16 is enabled to a logic high (H) level, the NOR gates NOR1 and NOR2 block the signals applied to the package option pads PAD X4 and PAD X8. Therefore, all of the package option signals sX4 and sX8 are a logic low (L) level, so that the corresponding chip operates as X16.

Figure 9:
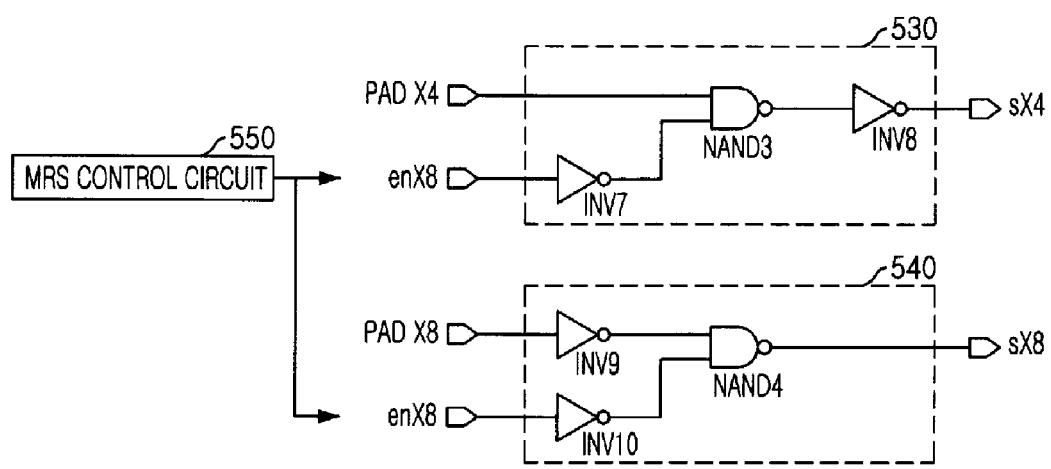

FIG. 9 is a third exemplary circuit diagram of the buffer unit 62 in accordance with the first embodiment of the present invention.

FIG. 9 illustrates the case of outputting the buffer control signal enX8 for selecting the X8 option in the test mode. A first buffer unit 530 includes: an inverter INV7 receiving the buffer control signal enX8; a NAND gate NAND3 receiving an output of the inverter INV7 and the signal applied to the package option pad PAD X4; and an inverter INV8 receiving an output of the NAND gate NAND3 to output the package option signal sX4. A second buffer unit 540 includes: an inverter INV9 receiving the signal applied to the package option pad PAD X8; an inverter INV10 receiving the buffer control signal enX8; and a NAND gate NAND4 receiving outputs of the inverters INV9 and INV10 to output the package option signal sX8.

It is assumed that the package option pads PAD X4 and PAD X8 are respectively bonded with the VSS pin and the VSS pin so that the corresponding chip operates as the default X4. Since the buffer control signal enX8 is a logic low (L) level in the normal mode, the package option signals sX4 and sX8 are respectively a logic high (H) level and a logic low (L) level so that the corresponding chip operates as the X4 package. Meanwhile, since the buffer control signal enX8 is a logic high (H) level in the test mode, the package option signals sX4 and sX8 are respectively a logic low (L) level and a logic high (H) level so that the corresponding chip operates as the X8 package.

A following table 5 is an operation table of an operation bandwidth in the normal mode and the test mode according to the package option (in case of using the enX8).

TABLE 5

| PACKAGE OPTION | X4 NORMAL MODE | X8 | X4 TEST MODE (enX8 "H") | X8 |
|---|---|---|---|---|
| PAD X4 | VDD | VSS | VDD | VSS |
| PAD X8 | VSS | VDD | VSS | VDD |
| sX4 | H | L | L | L |
| sX8 | L | H | H | H |
| OPERATION BANDWIDTH | X4 | X8 | X8 | X8 |

Referring to the table 5, in case of the X4 product, since the entire cells connected to one word line can be screen by performing the test 1024 times, the test time can be reduced to ½ of the prior art. Meanwhile, in case where the above buffer control signal enX8 is used in the X16 product, there is not profitable so that the table 5 does not consider the X16 product.

Figure 10:
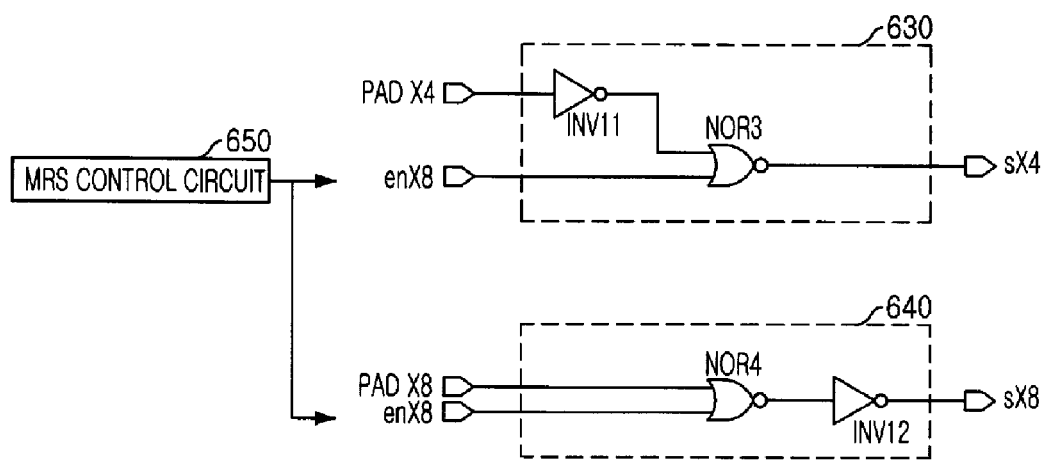

FIG. 10 is a fourth exemplary circuit diagram of the buffer unit 62 in accordance with the first embodiment of the present invention.

A difference between FIG. 10 and FIG. 9 is configurations of first and second buffer units 630 and 640. The first buffer unit 430 includes an inverter INV11 receiving the signal applied to the package option pad PAD X4, and a NOR gate NOR3 receiving the buffer control signal enX8 outputted from the MRS control circuit 650 and an output of the inverter INV11 to output the package option signal sX4. The second buffer unit 640 includes a NOR gate NOR4 receiving the signal applied to the package option pad PAD X8 and the buffer control signal enX8 outputted from the MRS control circuit 650, and an inverter INV12 receiving an output of the NOR gate NOR4 to output the package option signal sX8.

Although the first and second buffer units 630 and 640 are implemented using the NOR gates, the buffer units operate in the same manner as those of FIG. 9 so that the operation table is also the same as the table 5. In other words, since the buffer control signal enX8 is a logic low level in the normal mode, the NOR gates NOR3 and NOR4 operate like an inverter so that the package option signals sX4 and sX8 are determined according to the bonding state of the package option pads PAD X4 and PAD X8. On the other hand, in the test mode, since the buffer control signal enX8 is enabled to a logic high (H) level, the NOR gates NOR3 and NOR4 block the signals applied to the package option pads PAD X4 and PAD X8. Therefore, the package option signals sX4 and sX8 are respectively a logic low (L) level and a logic (H) level, so that the corresponding chip operates as X8.

Figure 11:
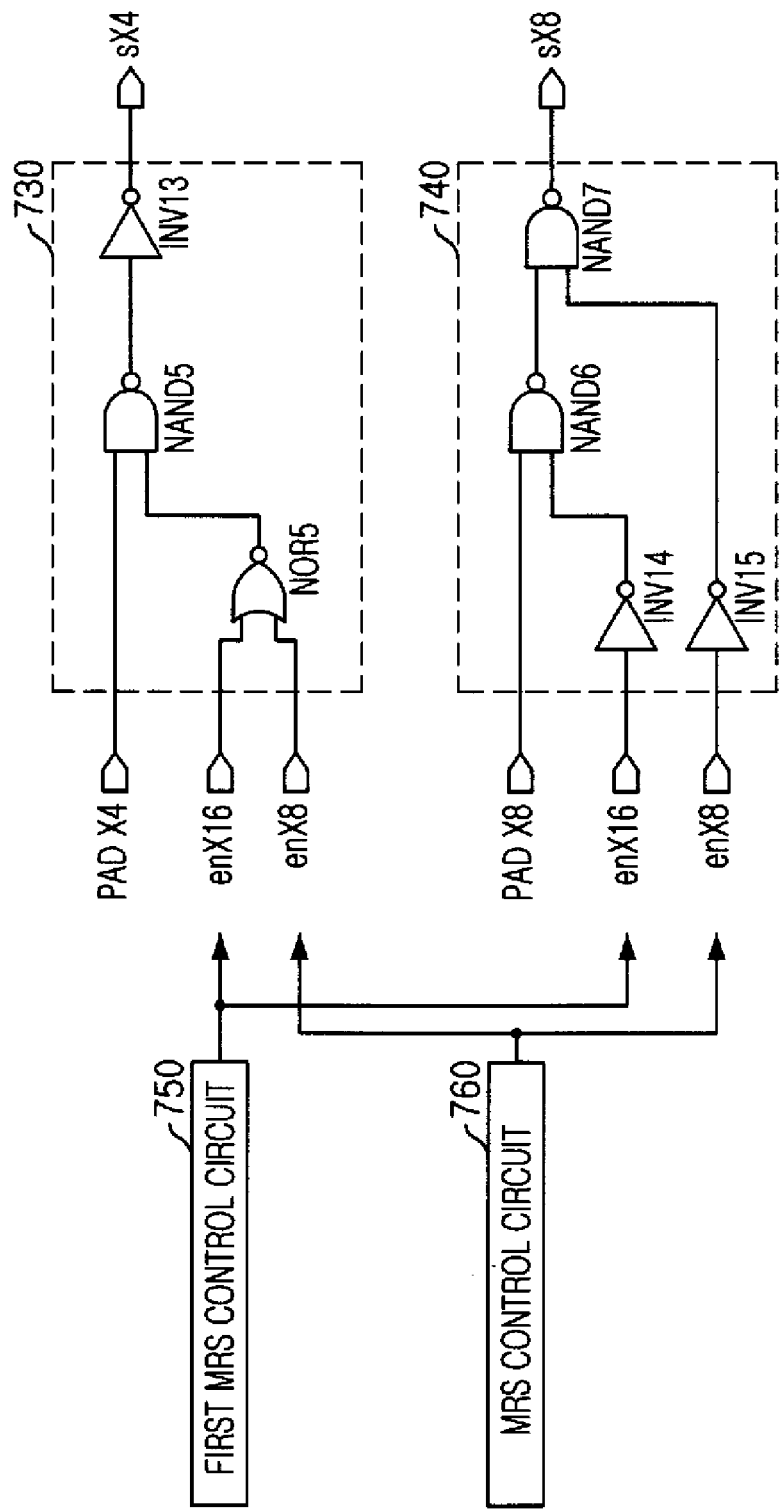

FIG. 11 is a fifth exemplary circuit diagram of the buffer unit 62 using first and second MRS control circuits 750 and 760 in accordance with a first embodiment of the present invention, in which two buffer control signals enX16 and enX8 are used.

Referring to FIG. 11, the first buffer unit 730 includes: a NOR gate NOR 5 receiving the first and second buffer control signals enX16 and enX8; a NAND gate NAND5 receiving an output of the NOR5 and the signal applied to the package option pad PAD X4; and inverter INV13 receiving an output of the NAND gate NAND5 to output the package option signal sX4. The second buffer unit 740 includes: an inverter INV14 receiving the first buffer control signal enX16; an inverter INV15 receiving the second buffer control signal enX8; a NAND gate NAND6 receiving an output of the inverter INV14 and the signal applied to the package option pad PAD X8; and a NAND gate NAND7 receiving outputs of the NAND gate NAND6 and inverter INV15 to output the package option signal sX8.

Hereinafter, an operation of the semiconductor memory device with the circuit of FIG. 11 will be described in detail.

In the normal mode, since all of the first and second buffer control signals enX16 and enX8 are a logic low (L) level, all of the NAND gates NAND5, NAND6 and NAND7 operate like an inverter so that the package option signals sX4 and sX8 represent the signal levels corresponding to the default bandwidth according to the bonding states of the package option pads PAD X4 and PAD X8. As a result, the corresponding chip operations as the default bandwidth.

In the test mode, the first and second buffer control signals enX16 and enX8 are selectively enabled.

First, in case where the first buffer control signal enX16 is enabled, since the first buffer control signal enX16 is a logic high (H) level and the second buffer control signal enX8 is a logic low (L) level, the NOR gate NOR5 of the first buffer unit 730 outputs a logic low level. The NAND gate NAND5 blocks the signal applied to the package option pad PAD X4 and outputs a logic high level. This signal is inverted by the inverter INV13 and then outputted as the package option signal sX4 of a logic low level. Meanwhile, the NAND gate NAND6 of the second buffer 740 blocks the signal applied to the package option pad PAD X8 and outputs a logic high level. This signal is inverted by the NAND gate NAND7 and then outputted as the package option signal sX8 of a logic low level. Accordingly, the corresponding chip operates as the X16 in the test mode.

Second, in case where the second buffer control signal enX8 is enabled, since the first buffer control signal enX16 is a logic low (L) level and the second buffer control signal enX8 is a logic high (H) level, the NOR gate NOR5 of the first buffer unit 730 outputs a logic low level. The NAND gate NAND5 blocks the signal applied to the package option pad PAD X4 and outputs a logic high level. This signal is inverted by the inverter INV13 and then outputted as the package option signal sX4 of a logic low level. Meanwhile, the NAND gate NAND7 of the second buffer 740 receives the logic low level via the inverter INV15 so that the package option signal sX8 of a logic high (H) level is outputted with regard to other inputs. Accordingly, the corresponding chip operates as the X8 in the test mode.

A following table 6 is an operation table of an operation bandwidth in the normal mode and the test mode according to the package option (in case of using the enX16 and the enX8).

TABLE 6

| | X4 | X8 | X16 | X4 | X8 | X4 | X8 | X16 |
|---|---|---|---|---|---|---|---|---|
| PACKAGE OPTION | NORMAL MODE enX8 "L", enX16 "L" | | | TEST MODE enX8 "L", enX16 "L" | | TEST MODE enX8 "8", enX16 "L" | | |
| PAD X4 | VDD | VSS | VSS | VDD | VSS | VDD | VSS | VSS |
| PAD X8 | VSS | VDD | VSS | VSS | VDD | VSS | VDD | VSS |
| SX4 | H | L | L | L | | L | | |
| SX8 | L | H | L | H | | L | | |
| OPERATION BANDWIDTH | X4 | X8 | X16 | X8 | X8 | X16 | X16 | X16 |

Referring to the table 6, in case of the product packaged in the default X4, if the package option signal enX8 is enabled, the test time can be reduced to ½ of the prior art. If the package option signal enX16 is enabled, the test time can be reduced to ¼ of the prior art.

Figure 12:
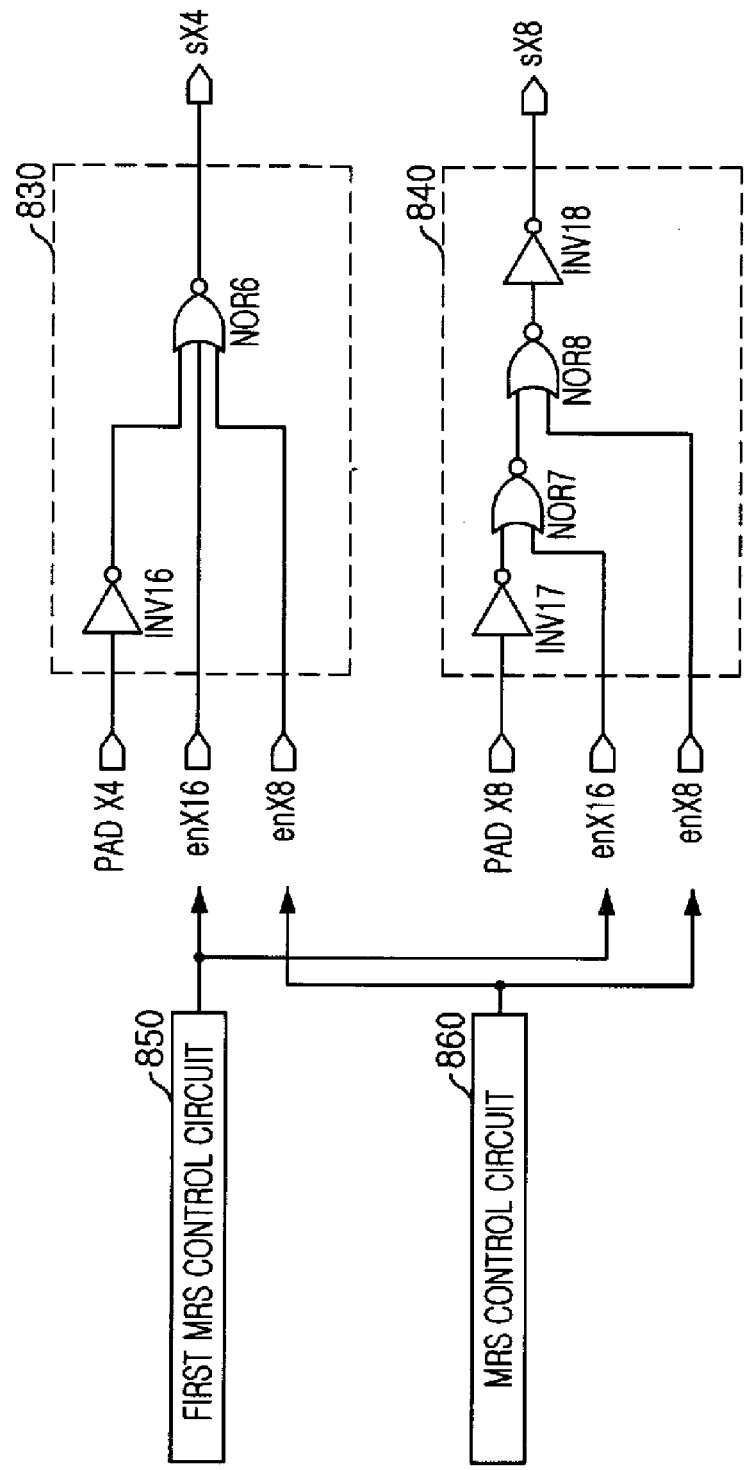

FIG. 12 is a sixth exemplary circuit diagram of the buffer unit 62 using first and second MRS control circuits 850 and 860 in accordance with a first embodiment of the present invention, in which two buffer control signals enX16 and enX8 are used.

Referring to FIG. 12, the first buffer unit 830 includes: an inverter INV16 receiving the signal applied to the package option pad PAD X4, and a 3-input NOR gate NOR6 receiving an output of the inverter INV16 and the first and second buffer control signals enX16 and enX8. The second buffer 840 includes: an inverter INV17 receiving the signal applied to the package option pad PAD X8; a NOR gate NOR7 receiving an output of the inverter INV17 and the first buffer control signal enX16; a NOR gate NOR8 receiving an output of the NOR gate NOR7 and the second buffer control signal enX8; and an inverter INV18 receiving an output of the NOR gate OR8 to output the package option signal sX8.

Since the above circuit operates in the same manner as that of FIG. 11, a detailed description about that will be omitted. The operation table is also the same as the table 6. In accordance with the first embodiment of the present invention, it is possible to perform the package test with the bandwidth except for the default bandwidth without modification of wiring with respect to the package option pads. Accordingly, the time taken to modify the wiring can be saved. Meanwhile, in accordance with the first embodiment of the present invention, it is possible to reduce the test time so that the test can be performed with upper bandwidth than the default package, so that the test time is remarkably reduced. In this case, it is possible to perform the failure detection using one test program (for maximum bandwidth) without regard to the package option.

SECOND EMBODIMENT

In the second embodiment of the present invention, there is proposed a buffer unit 62 using two package option pads PAD X4 and PAD X8. The buffer unit with a switching structure controlled by buffer control signals test_mode_X8z and test_mode_X4z buffers and outputs the signals applied to two package option pads PAD X4 and PAD X8 (normal mode), or provides the package option signals sX4 and sX8 corresponding to desired bandwidth (test mode).

Figure 13:
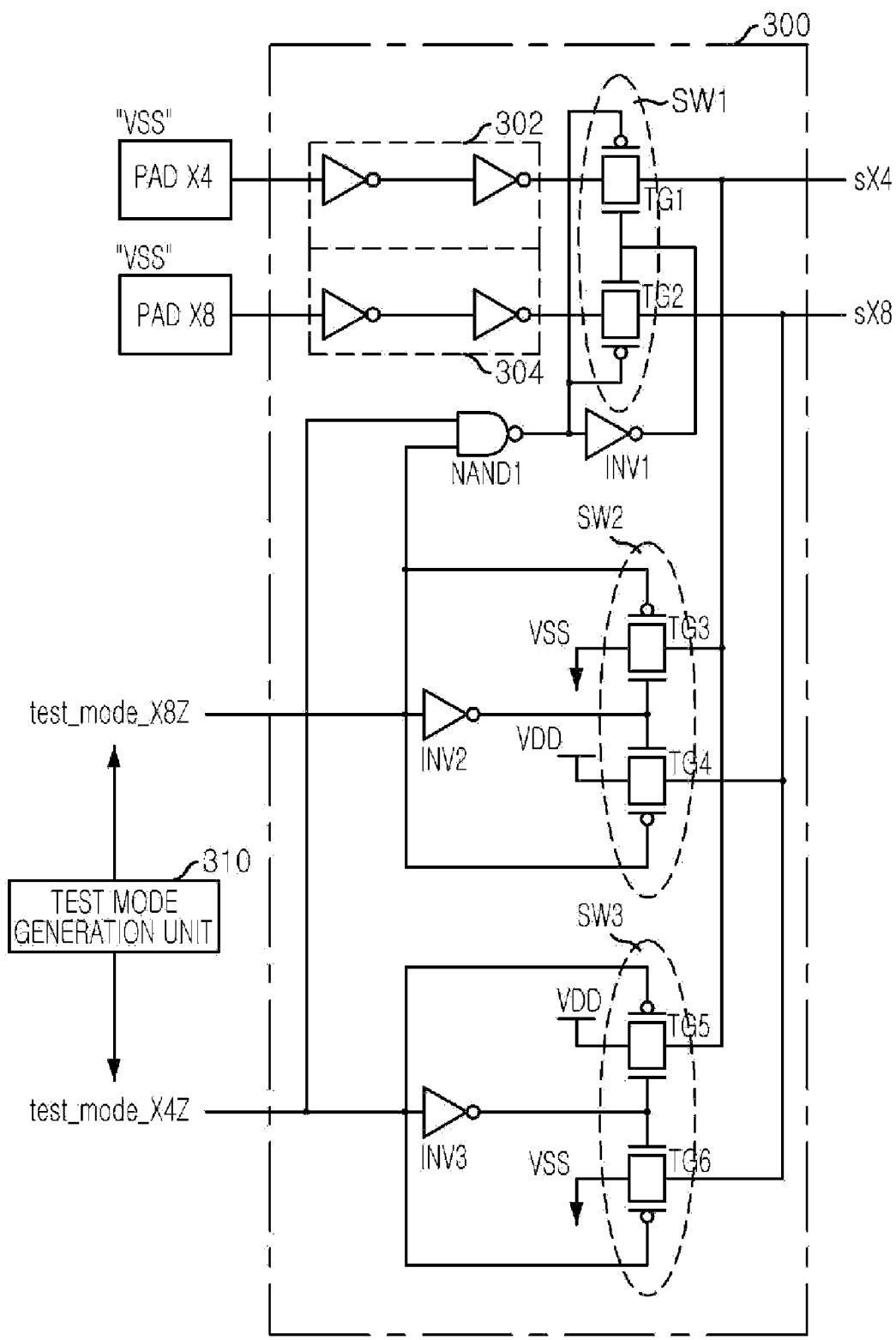
FIG. 13 is a circuit diagram of a package option signal generation circuit in accordance with a second embodiment of the present invention.

FIG. 13 is a circuit diagram of the package option signal generation circuit in accordance with a second embodiment of the present invention, showing the case wired with the default X16 product.

Referring to FIG. 13, the package option signal generation circuit includes: a package option pad PAD X4 wire-bonded with VSS pin; a package option pad PAD X8 wire-bonded with the VSS pin; a test mode generation unit 310 for generating two buffer control signals test_mode_X8z and test_mode_X4z for selecting X8 and X4 package options in the test mode; and a buffer unit 300 for buffering the signals applied to the package option pads PAD X4 and PAD X8 in response to the two buffer control signals test_mode_X8z and test_mode_X4z to output the buffered signals as the package option signals sX4 and sX8 (normal mode), or for providing the package option signals sX4 and sX8 corresponding to the desired bandwidth (test mode).

The buffer unit 300 includes: a first buffer 302 for buffering an external signal applied to the package option pad PAD X4 to generate the package option signal sX4; and a second buffer 304 for buffering an external signal applied to the package option pad PAD X8 to generate the package option signal sX8. Here, the first and second buffers 302 and 304 are respectively provided with two inverters connected in series to each other.

In addition, the buffer 300 includes: first to third switching unit SW1, SW2 and sW3 performing a selective switching operation; a logic gate for logically combining the two buffer control signals test_mode_X8z and test_mode_X4z and controlling the first to third switching unit SW1, SW2 and SW3. If the package option is two, there is needed only one package option pad and one buffer control signal. In this case, the logic gate for combining the buffer control signals is not needed. Therefore, in the buffer unit 300, the others except for the first and second buffer 302 and 304 can be considered as the switching structure.

The first switching unit SW1 includes transmission gates TG1 and TG2 for transferring outputs of the first and second buffers 302 and 304 to an output stage in response to an output of a NAND gate NAND1 receiving the buffer control signals test_mode_X8z and test_mode_X4z. The transmission gates TG1 and TG2 receive an output of the NAND gate NAND1 and an inverted signal outputted from an inverter INV1 in the same polarity and are simultaneously turned on/off. The second switching unit SW2 includes transmission gates TG3 and TG4 for transferring VSS and VDD to the output stage in response to the buffer control signal test_mode_X8z. The transmission gates TG3 and TG4 receive the buffer control signal test_mode_X8z and an inverted signal outputted from an inverter INV2 in the same polarity and are simultaneously turned on/off. The third switching unit SW3 includes transmission gates TG5 and TG6 for transferring VSS and VDD to the output stage in response to the buffer control signal test_mode_X4z. The transmission gates TG5 and TG6 receive the buffer control signal test_mode_X4z and an inverted signal outputted from an inverter INV3 in the same polarity and are simultaneously turned on/off.

Here, the NAND gate NAND1 can be implemented with an AND gate and an inverter, and can be replaced with other logic gates (for example, NOR gate). Further, the transmission gates TG1 to TG6 can be replaced with other switching devices (for example, MOS transistor).

Hereinafter, an operation of the semiconductor memory device with the package option signal generation circuit will be described.

First, in case of the normal mode, all of the buffer control signal test_mode_X8z and test_mode_X4z are a logic high level. Therefore, since an output of the NAND gate NAND1 and an output of the inverter INV1 are respectively a logic low level and a logic high level, two transmission gates TG1 and TG2 are turned on so that the buffer units 302 and 304 generate their outputs as the package option signals sX4 and sX8. In FIG. 7, since the package option pads PAD X4 and PAD X8 are wire-bonded with the VSS pin so that the package option signals sX4 and sX8 are a logic low level, the chip operates as the X16.

In the test mode, by enabling one of the buffer control signals test_mode_X8z and test_mode_X4z to a logic low level, the transmission gates TG1 and TG2 are tuned on by setting the outputs of the NAND gate NAND1 and inverter INV1 to a logic high level and a logic low level, respectively.

In case where the buffer control signal test_mode_X8z is outputted in a logic high level and the buffer control signal test_mode_X4z is outputted in a logic low level, the transmission gates TG1 and TG2 of the first switching unit are all turned off so that the path of the first and second buffers 302 and 304 are blocked. Meanwhile, the transmission gates TG3 and TG4 of the second switching unit SW2 are turned on so that the VSS and the VDD are outputted, respectively. At this time, the package option signals sX4 and sX8 are a logic low level and a logic high level, respectively, so that the chip operates as the X8.

In case where the buffer control signal test_mode_X8z is outputted in a logic low level and the buffer control signal test_mode_X4z is outputted in a logic high level, the transmission gates TG1 and TG2 of the first switching unit are all turned off so that the path of the first and second buffers 302 and 304 are blocked. Meanwhile, the transmission gates TG5 and TG6 of the second switching unit SW2 are turned on so that the VDD and the VSS are outputted, respectively. At this time, the package option signals sX4 and sX8 are a logic high level and a logic low level, respectively, so that the chip operates as the X4.

A following table 7 is an operation table of an operation bandwidth in the test mode in the X16 package of the semiconductor memory device having the package option signal generation circuit in accordance with the second embodiment of the present invention.

TABLE 7

|  | X4 | X8 | X16 |
| --- | --- | --- | --- |
| test_mode_X4 | L | H | H |
| test_mode_X8 | H | L | H |
| sX4 | H | L | L |
| sX8 | L | H | L |

Referring to the table 7, in case where the default package is X16, if the buffer control signals test_mode_X4z and test_mode_X8z are respectively a logic low level and a logic high level, the corresponding package operates as the X4, so that a characteristic of the X4 package can be tested. If the buffer control signals test_mode_X4z and test_mode_X8z are respectively a logic high level and a logic low level, the corresponding package operates as the X8 so that a characteristic of the X8 package can be tested. In the present invention, the test mode means a test mode for changing the package option. The characteristic of the X16 package is tested in the normal mode state. Accordingly, with respect to one chip in which the default package is completed, it is possible to simply test a characteristic of other bandwidths as well as the default bandwidth without modifying the wiring.

Meanwhile, although the table 7 illustrates the test mode operation in the X16 package, it is also applicable to the X8 package and the X4 package. For example, in the X8 package, the VSS pin and the VDD pin is wire-bonded with the package option pads PAD X4 and PAD X8, respectively. To control the test mode bandwidth, the buffer control signals test_mode_X4 and test_mode_X16z are used.

Following tables 8 and 9 are operation tables of an operation bandwidth in the test mode in the X8 package and the X4 package, respectively. It is noted that the wire bonding is performed with respect to all the DQ pins as shown in FIG. 5 in case where the present invention is applied to the X8 package and the X4 package.

TABLE 8

|  | X4 | X8 | X16 |
| --- | --- | --- | --- |
| test_mode_X4 | L | H | H |
| test_mode_X1 | H | H | H |
| sX4 | H | L | L |
| SX8 | L | H | L |

TABLE 9

|  | X4 | X8 | X16 |
| --- | --- | --- | --- |
| test_mode_X8 | H | L | H |
| test_mode_X1 | H | H | L |
| sX8 | H | L | L |
| SX8 | L | H | L |

In the first and second embodiments of the present invention, since the package test can be performed with the bandwidth except for the default bandwidth without modifying the wiring with respect to the package option pads, the time required to modify the wiring can be saved.

Although the above embodiments describes the case the X4/X8/X16 package options are determined using the X4 PAD and the X8 PAD as the package option pad, the present invention is also applicable the case of using the X4 PAD and the X16 PAD as the package option pad or using the X8 PAD and the X16 PAD as the package option pad. In this case, combinations of the logic gates constituting the buffer unit can be varied.

Meanwhile, the NAND gates used in the above embodiments can be implemented with an AND gate and an inverter, and the NOR gate can be implemented with an OR gate and an inverter.

Further, the present invention is also applicable to the case the number of the package option pads increase or decreases according to the number of the operation bandwidth.

According to the present invention, the test cost can be reduced so that the manufacturing cost can be reduced. Further, the test time is reduced so that the productivity is remarkably increased.

While the present invention has been described with respect to certain preferred embodiments only, other modifications and variation may be made without departing from the spirit and scope of the present invention as set forth in the following claims.

What is claimed is:

1. A semiconductor memory device comprising:
   at least one package option pad wire-bonded with pins as a default package option;
   a buffer control signal generation means for generating a buffer control signal; and
   a buffering means for, in a normal mode, buffering a signal applied to the package option pad in response to the buffer control signal and outputting the buffered signal as a package option signal, and in a test mode, blocking the applied signal and outputting a signal corresponding to a signal other than the applied signal as the package option signal.

2. The semiconductor memory device as recited in claim 1, further comprising: a plurality of data input/output pins; and a plurality of wires bonded to the respective data input/output pins.

3. A semiconductor memory device comprising: first and second package option pads wire-bonded with pins as a default package option;
   a buffer control signal generation means for generating a buffer control signal;
   a first buffering means for, in a normal mode, buffering a first signal applied to the first package option pad in response to the buffer control signal and outputting the buffered first signal as a first package option signal, and in a test mode, blocking the first applied signal and outputting a signal corresponding to a signal other than the first applied signal as the first package option signal; and
   a second buffering means for, in a normal mode, buffering a second signal applied to the second package option pad in response to the buffer control signal and outputting the buffered second signal as a second package option signal, and in a test mode, blocking the second applied signal and outputting a signal corresponding to a signal other than the second applied signal as the second package option signal.

4. The semiconductor memory device as recited in claim 3, further comprising:
   a plurality of data input/output pins; and
   a plurality of wires bonded to the respective data input/output pins.

5. The semiconductor memory device as recited in claim 4, wherein the first buffering means includes:
   a first inversion means for inserting the buffer control signal;
   a first NAND gate for NANDing the first applied signal and an output of the first inversion means; and
   a second inversion means for inverting an output of the first NAND gate and outputting the first package option signal.

6. The semiconductor memory device as recited in claim 5, wherein the second buffering means includes:
   a third inversion means for inverting the buffer control signal;
   a second NAND gate for NANDing the second applied signal and an output of the third inversion means;
   and a fourth inversion means for inverting an output of the second NAND gate and outputting the second package option signal.

7. The semiconductor memory device as recited in claim 5, wherein the second buffering means includes:
   a third inversion means for inverting the second applied signal;
   a fourth inversion means for inverting the buffer control signal; and
   a second NAND gate for NANDing outputs of the third and fourth inversion means.

8. The semiconductor memory device as recited in claim 4, wherein the first buffering means includes:
   a first inversion means for inverting the first applied signal; and
   a first NOR gate for NORing an output of the first inversion means and the buffer control signal, and outputting the first package option signal.

9. The semiconductor memory device as recited in claim 8, wherein the second buffering means includes:
   a second inversion means for inverting the second applied signal; and
   a second NOR gate for NORing an output of the second inversion means and the buffer control signal, and outputting the second package option signal.

10. The semiconductor memory device as recited in claim 8, wherein the second buffering means includes:
    a second NOR gate for NORing the second applied signal and the buffer control signal; and
    a second inversion means for inverting an output of the second NOR gate and outputting the second package option signal.

11. The semiconductor memory device as recited in claim 4, wherein the first buffering means includes:
    a first NOR gate for NORing first and second buffer control signals;
    a first NAND gate for NANDing the second applied signal and an output of the first NOR gate; and
    a first inversion means for inverting an output of the first NAND gate and outputting the first package option signal.

12. The semiconductor memory device as recited in claim 11, wherein the second buffering means includes:
    a second inversion means for inverting the first buffer control signal; a third inversion means for inverting the second buffer control signal;
    a second NAND gate for NANDing the second applied signal and an output of the second inversion means; and
    a third NAND gate for NANDing an output of the third inversion means and an output of the second NAND gate and outputting the second package option signal.

13. The semiconductor memory device as recited in claim 4, wherein the first buffering means includes:
    a first inversion means for inverting the first applied signal; and
    a first NOR gate for NORing the first and second buffer control signals and an output of the first inversion means.

14. The semiconductor memory device as recited in claim 13, further comprising:
    a second inversion means for inverting the second applied signal;
    a second NOR gate for NORing an output of the second inversion means and the first buffer control signal;
    a third NOR gate for NORing an output of the second NOR gate and the second buffer control signal; and a third inversion means for inverting an output of the third NOR gate and outputting the second package option signal.

15. The semiconductor memory devices recited in claim 3, wherein the buffer control signal generation means includes a mode register set control circuit.

16. The semiconductor memory device as recited in claim 3, wherein package options, other than the default package options, use higher bandwidth than the default package option.

17. The semiconductor memory device as recited in claim 16, wherein the package options other than the default package option use maximum bandwidth.

18. A semiconductor memory device comprising:
- at least one package option pad wire-bonded with pins as a default package option;
- a buffer control signal generation means for generating a buffer control signal;
- a buffering means for buffering signals applied to the at least one package option pad; and
- a switching means for, in response to the buffer control signal, transferring an output of the buffering means and a signal corresponding to package options, other than the default package options, as a package option signal.

19. The semiconductor memory device as recited in claim 18, further comprising:
- a plurality of data input/output pins; and
- a plurality of wires bonded to the respective data input/output pins.

20. The semiconductor memory device as recited in claim 19, wherein the at least one package option pad includes first and second option pads, and the buffering means includes a plurality of inverters connected in series with each other.

21. The semiconductor memory device as recited in claim 20, wherein the buffer control signal includes first and second control buffer control signals, and the switching means includes:
- at least one logic gate for performing a logical combination of the first and second buffer control signals;
- first and second switches for switching outputs of the first and second buffers in response to an output of the logic gate;
- third and fourth switches for outputting a signal set corresponding to a first package option other than the default package in response to the first buffer control signal; and
- fifth and sixth switches for outputting a signal set corresponding to the first package option other than the default package in response to the second buffer control signal.

22. The semiconductor memory device as recited in claim 21, wherein the first to sixth switches are provided with transmission gates, respectively.

23. The semiconductor memory device as recited in claim 21, wherein the buffer control signal generation means includes a test mode generator.

* * * * *